United States Patent
Takahashi et al.

(10) Patent No.: US 11,164,775 B2
(45) Date of Patent: Nov. 2, 2021

(54) METHOD OF MANUFACTURING SEMICONDUCTOR DEVICE

(71) Applicant: KIOXIA CORPORATION, Tokyo (JP)

(72) Inventors: Kazuki Takahashi, Yokkaichi Mie (JP); Shinya Okuda, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 74 days.

(21) Appl. No.: 16/807,025

(22) Filed: Mar. 2, 2020

(65) Prior Publication Data

US 2021/0082749 A1 Mar. 18, 2021

(30) Foreign Application Priority Data

Sep. 13, 2019 (JP) .............................. JP2019-167317

(51) Int. Cl.
H01L 21/768 (2006.01)
H01L 21/311 (2006.01)
H01L 21/02 (2006.01)

(52) U.S. Cl.
CPC .. H01L 21/76832 (2013.01); H01L 21/02211 (2013.01); H01L 21/02214 (2013.01); H01L 21/02274 (2013.01); H01L 21/31111 (2013.01); H01L 21/76831 (2013.01); H01L 21/76898 (2013.01)

(58) Field of Classification Search
CPC ......... H01L 21/76832; H01L 21/02211; H01L 21/0221; H01L 21/02274; H01L 21/3111; H01L 21/76831; H01L 21/76898
See application file for complete search history.

(56) References Cited

U.S. PATENT DOCUMENTS

| | | | |
|---|---|---|---|
| 5,966,634 A | 10/1999 | Inohara et al. | |
| 8,962,430 B2* | 2/2015 | Liu | H01L 29/66477 438/296 |
| 9,275,935 B2 | 3/2016 | Kitao et al. | |
| 2006/0183296 A1* | 8/2006 | Yoo | H01L 21/76232 438/424 |
| 2007/0290293 A1* | 12/2007 | Trivedi | H01L 21/76224 257/506 |
| 2013/0234341 A1 | 9/2013 | Onai | |
| 2013/0334603 A1* | 12/2013 | Cheng | H01L 29/78654 257/347 |
| 2015/0137238 A1 | 5/2015 | Tsunemi et al. | |
| 2019/0057996 A1 | 2/2019 | Oshige | |
| 2019/0088545 A1 | 3/2019 | Okuda | |
| 2019/0198337 A1 | 6/2019 | Shigetoshi et al. | |

FOREIGN PATENT DOCUMENTS

WO 2017/217132 A1 12/2017

* cited by examiner

*Primary Examiner* — Zandra V Smith
*Assistant Examiner* — Andre C Stevenson
(74) *Attorney, Agent, or Firm* — Kim & Stewart LLP

(57) ABSTRACT

A method of manufacturing a semiconductor device includes depositing a first insulation film in a via hole of a semiconductor substrate and above a first surface thereof, the semiconductor substrate having a circuit substrate on a second surface thereof, depositing a second insulation film having a covering property lower than the first insulation film in the via hole and above the first surface, and removing the first and second insulation films deposited at the bottom of the via hole by anisotropic etching.

20 Claims, 10 Drawing Sheets

METHOD OF MANUFACTURING SEMICONDUCTOR DEVICE

CROSS-REFERENCE TO RELATED APPLICATION(S)

This application is based upon and claims the benefit of priority from Japanese Patent Application No. 2019-167317, filed Sep. 13, 2019, the entire contents of which are incorporated herein by reference.

FIELD

Embodiments described herein relate generally to a method of manufacturing a semiconductor device.

BACKGROUND

To form a through silicon via (TSV) for a semiconductor device, it is known to use a silicon dioxide film containing tetraethyl orthosilicate as a Si component. The silicon dioxide film forms an insulation film that insulates between the TSV and a semiconductor substrate.

DETAILED DESCRIPTION

Figure 1:
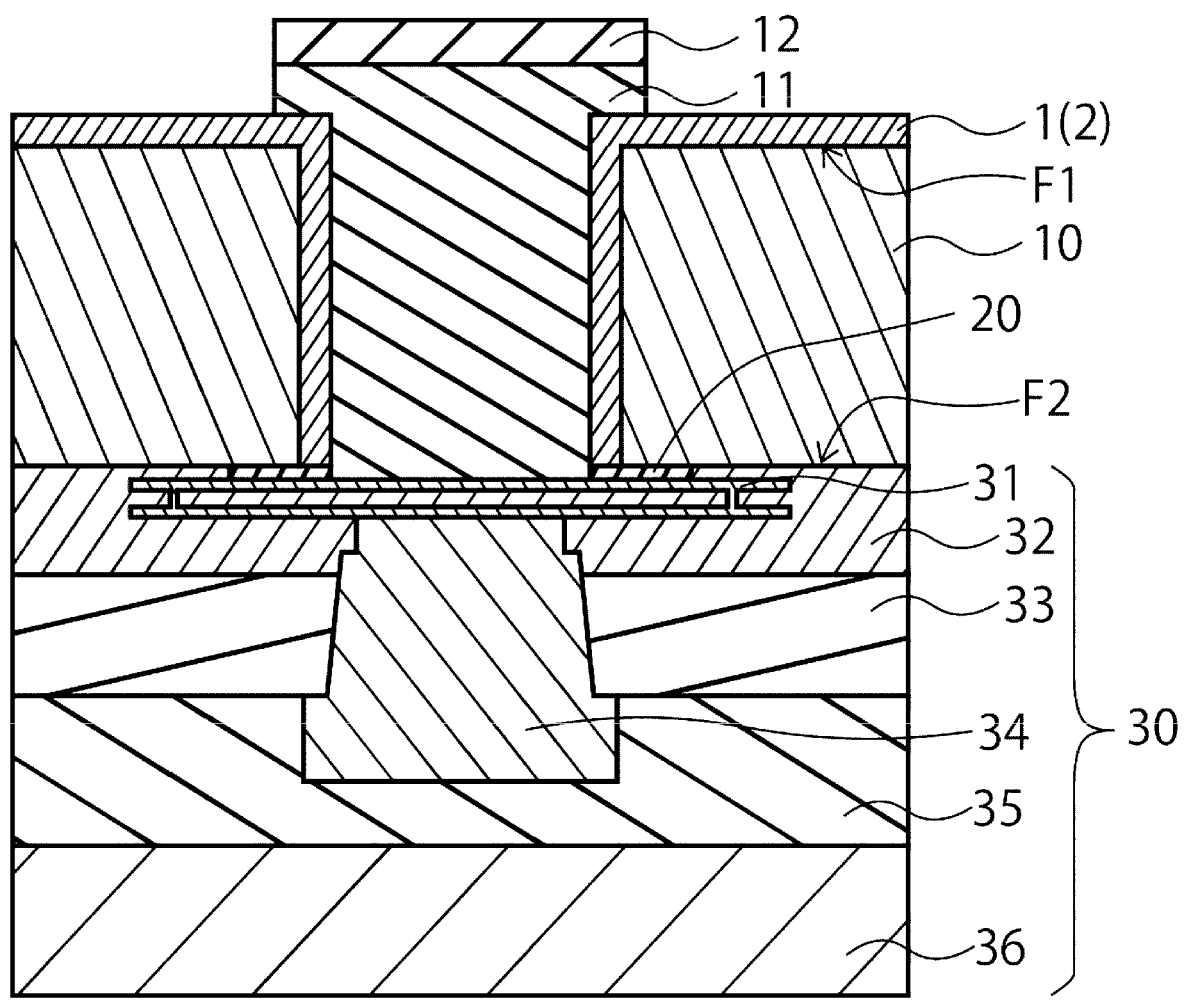
FIG. 1 is a sectional view of a semiconductor device according to an embodiment.

Embodiments provide a method of manufacturing a semiconductor device having an insulation film with a highly controlled film thickness.

In general, according to one embodiment, method of manufacturing a semiconductor device includes depositing a first insulation film in a via hole of a semiconductor substrate and above a first surface thereof, the semiconductor substrate having a circuit substrate on a second surface thereof, depositing a second insulation film having a covering property lower than the first insulation film in the via hole and above the first surface, and removing the first and second insulation films deposited at the bottom of the via hole by anisotropic etching.

Hereinafter, some embodiments will be described with reference to the drawings.

In this specification, some components are expressed by different terms. However, these expressions are merely examples, and the examples of the expressions for the components are not intended to exclude other expressions. Similarly, components that are not expressed in multiple ways may also be expressed by other words or phrases.

The drawings are outlines of embodiments, and therefore, a relationship between thickness and plane dimensions, a ratio of thickness between layers, change in thickness of each layer, and other parameters, may differ from those in the case of an actual semiconductor device. In addition, the drawings may include a part in which a relationship of dimensions and a ratio of dimensions differ between the drawings. In the drawings, reference symbols of some components may be omitted.

First Embodiment

Figure 2:
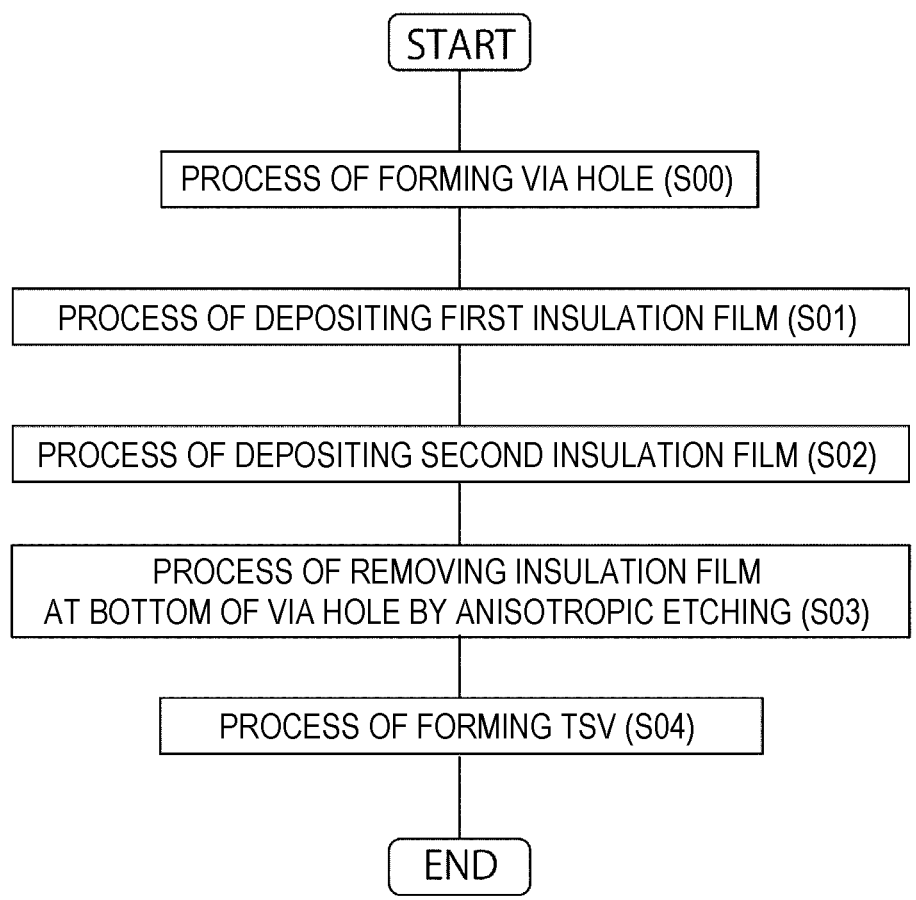
FIG. 2 is a flowchart for manufacturing the semiconductor device according to the embodiment.

The first embodiment relates to a method of manufacturing a semiconductor device. FIG. 1 illustrates a sectional view of a semiconductor device 100. FIG. 2 illustrates a flowchart of the method of manufacturing the semiconductor device 100 of the first embodiment. FIGS. 3 to 6 illustrate sectional views of the semiconductor device 100 during the manufacturing process. The semiconductor device 100 is, more specifically, a memory device such as a NAND flash memory chip.

The sectional view in FIG. 1 illustrates a main part of the semiconductor device 100. The semiconductor device 100 in FIG. 1 is an example of a memory device. The semiconductor device 100 is manufactured by the method of manufacturing the semiconductor device 100 of the embodiment. The semiconductor device 100 includes a semiconductor substrate 10, a first insulation film 1 or a second insulation film 2, a TSV 11, a bump 12, and a semiconductor layer 30. The following describes the structure of the semiconductor device 100. The structure of the semiconductor layer 30 is not limited to the structure shown in FIG. 1, and the manufacturing method according to the embodiment can be applied regardless of the structure of the semiconductor layer 30. While the first insulation film 1 is formed on a side wall of a via hole VH and on a first surface F1 of the semiconductor substrate 10 in FIG. 1, a second insulation film 2 may be used instead of the first insulation film 1. The embodiment also includes a structure having both of a first insulation film 1 and a second insulation film 2 that are formed on the side wall of the via hole VH and on the first surface F1 of the semiconductor substrate 10.

The semiconductor substrate 10 has the first surface F1 and a second surface F2, and the via hole VH is provided from the first surface F1 toward the second surface F2. The via hole VH contains the first insulation film 1 and the TSV 11. The first insulation film 1 is formed on the first surface F1. The TSV 11 is a through via that passes through the via hole VH.

The semiconductor substrate 10 is, for example, a silicon substrate or a silicon wafer. Although not illustrated in the drawing, a semiconductor element is formed on a lower side of the semiconductor substrate 10 in FIG. 1. The semiconductor element includes, for example, a memory cell array, and is located in an insulation film 32 of the semiconductor layer 30.

Preferably, the first insulation film 1 is in direct contact with the side wall of the via hole VH to insulate between the semiconductor substrate 10 at the side wall of the via hole VH and the TSV 11. Similarly, it is preferable that the first insulation film 1 is in direct contact with the first surface F1 of the semiconductor substrate 10 to insulate between the first surface F1 of the semiconductor substrate 10 and the TSV 11.

The TSV 11 is preferably in direct contact with a wiring circuit 31 contained in the semiconductor layer 30. The TSV 11 and the wiring circuit 31 are electrically coupled to each other. The TSV 11 is electrically coupled to the semiconductor element via the wiring circuit 31.

The semiconductor layer 30 has, for example, a stacked structure of the insulation film 32, an insulation film 33, an adhesive layer 35, and a support substrate 36, in this order from the semiconductor substrate 10, as illustrated by the sectional view in FIG. 1. The insulation films 32 and 33 cover the wiring circuit 31 and the semiconductor element, which is not illustrated in the drawing. A bump 34 is provided from the inside of the adhesive layer 35 to the insulation film 32 or to the wiring circuit 31. The bump 34 may be in direct electric contact with the wiring circuit 31. The adhesive layer 35 bonds the insulation film 33 and the support substrate 36. The semiconductor device in which both of the adhesive layer 35 and the support substrate 36 are removed after the TSV 11 and the bump 12 are formed is also regarded as the semiconductor device 100 in the embodiment.

Preferably, an insulation film is provided between the wiring circuit 31 and the semiconductor substrate 10 in order to prevent leakage between the semiconductor layer 30 and the semiconductor substrate 10. An example of this insulation film includes a silicon oxide film called a shallow trench isolation (STI) film. FIG. 1 illustrates an STI film 20.

Next, the method of manufacturing the semiconductor device 100 will be described with reference to the flowchart in FIG. 2 and the sectional views during the manufacturing process in FIGS. 3 to 6. The following describes a process of forming the TSV 11. Descriptions for a process of forming the semiconductor element and other circumferential components and other relevant descriptions are omitted.

As illustrated in the flowchart in FIG. 2, the method of manufacturing the semiconductor device 100 involves a process of forming a via hole VH (S00), a process of depositing a first insulation film 1 (S01), a process of depositing a second insulation film 2 (S02), a process of removing the insulation film at the bottom of the via hole VH by anisotropic etching (S03), and a process of forming a TSV 11 (S04).

Figure 3:
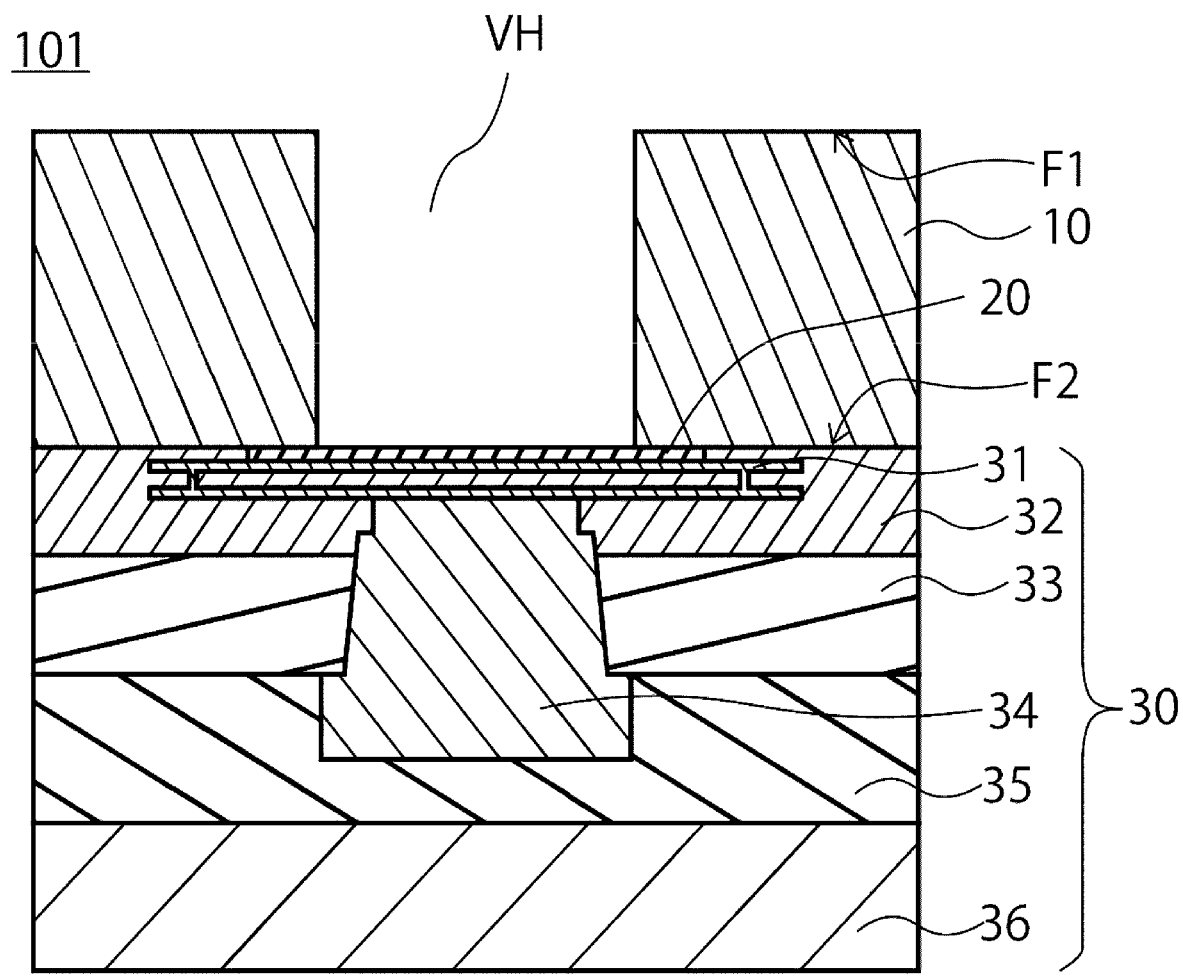
FIGS. 3-10 are sectional views of the semiconductor device during a manufacturing process according to the embodiment.

The process of forming a via hole VH (S00) is described with reference to FIG. 3. As illustrated in FIG. 3, a via hole VH is formed to pass through the semiconductor substrate 10 from the first surface F1 toward the second surface F2 of the semiconductor substrate 10, whereby a workpiece 101 is obtained. The via hole VH is formed by, for example, a reactive ion etching (RIE) method using a mask of a photoresist, which is not illustrated in the drawing. Forming the via hole VH exposes the STI film 20 on the surface on the semiconductor substrate 10 side of the semiconductor layer 30.

It is desired to thin the semiconductor substrate 10 in order to satisfy the request for thinning such as in a NAND flash memory chip. A thinned semiconductor substrate 10 has a small aspect ratio of the via hole VH. The aspect ratio is represented by (depth of the via hole VH, i.e., thickness of the semiconductor substrate 10)/(diameter of the via hole VH, i.e., circumscribed circle diameter of the via hole VH). A large aspect ratio of the via hole VH causes deposition of a thin insulation film at the bottom of the via hole VH. Thus, the insulation film to be removed by etching in the later process is thin, whereby it is easy to make an insulation film having a sufficient thickness remain on the first surface F1 of the semiconductor substrate 10. This insulation film has a thickness of 500 nm or more, for example. On the other hand, in a case of forming only a first insulation film 1 with a high covering property, a small aspect ratio of the via hole VH causes formation of a thick first insulation film 1 at the bottom of the via hole VH when a first insulation film 1 with a required thickness is formed on the side wall and on the first surface F1. Removing the thick first insulation film 1 at the bottom of the via hole VH also removes the first insulation film 1 on the side wall of the via hole VH and on the first surface F1. In a case of using a second insulation film 2 with a low covering property, an insulation film may not be sufficiently formed at the bottom side of the side wall of the via hole VH. Thus, adapting an existing method of forming an insulation film in a via hole VH makes it difficult to form an insulation film with a required thickness in a via hole VH with a small aspect ratio. In view of this, the manufacturing method of the embodiment is preferably adapted because the thickness of an insulation film subjected to etching is easy to control irrespective of the magnitude of the aspect ratio.

Figure 4:
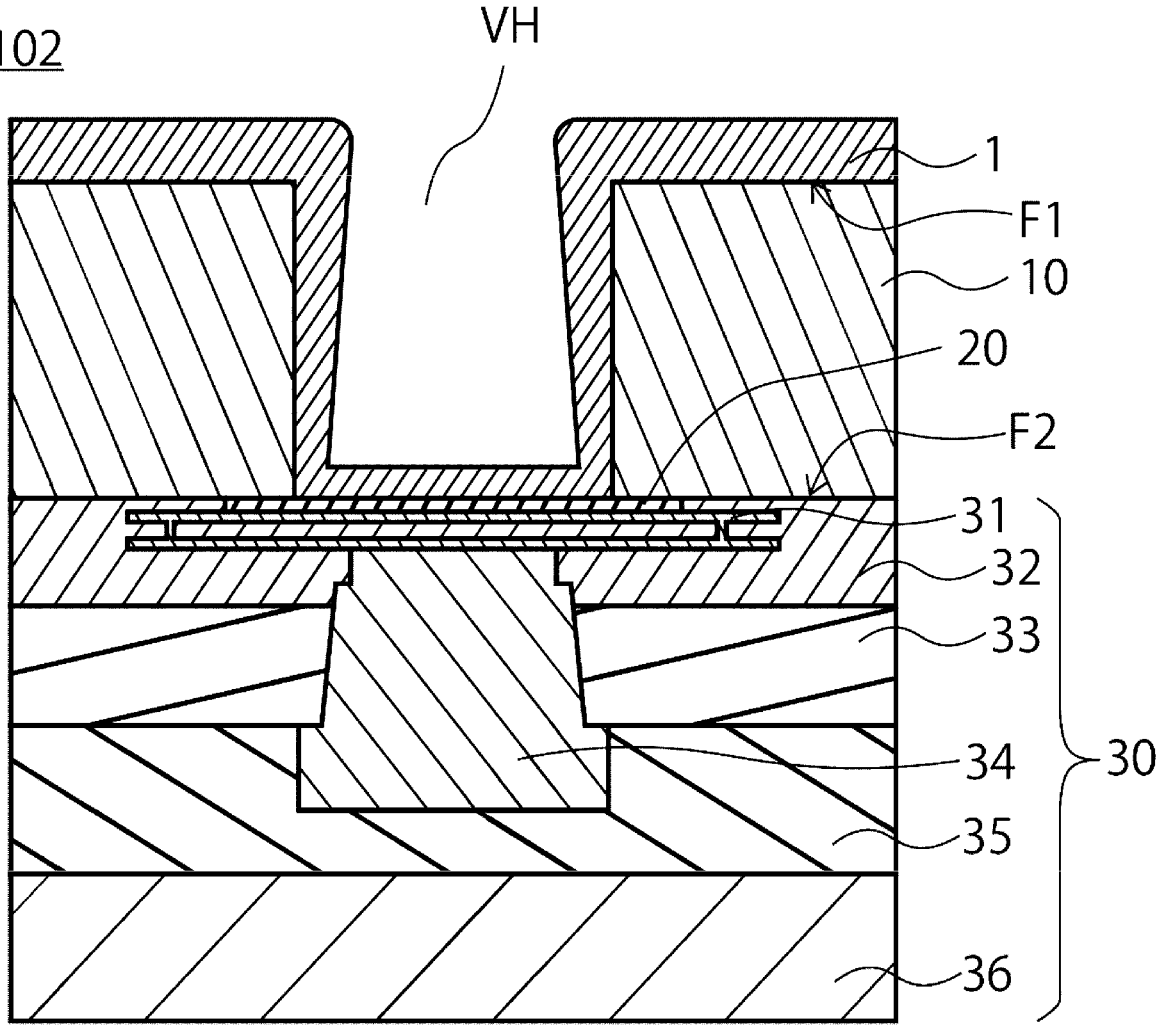

Next, the process of depositing a first insulation film 1 (S01) is described. As illustrated in FIG. 4, a first insulation film 1 having a high covering property is deposited in the via hole VH and on the first surface F1 of the workpiece 101 in FIG. 3, whereby a workpiece 102 is obtained. Preferably, the first insulation film 1 having the high covering property is formed on the entire surfaces of the bottom and the side wall of the via hole VH and on the entire surface of the first surface F1 of the semiconductor substrate 10.

The first insulation film 1 is preferably deposited by a plasma CVD method. Adapting the plasma CVD method causes a thick first insulation film 1 at the opening of the via hole VH, whereby a large overhang is obtained. The large overhang prevents an increase in thickness of the first insulation film 1 at the bottom of the via hole VH. The plasma CVD method is preferably adapted in order to make a relatively thick insulation film remain on the first surface F1 of the semiconductor device 100 to be manufactured. As for a thick insulation film at the bottom of the via hole VH, in removing the insulation film at the bottom of the via hole VH by etching, the insulation film that is formed on the first surface F1 of the semiconductor substrate 10 and the insulation film that is formed on the side wall of the via hole VH tend to be greatly thinned or be removed.

The temperature of deposition of the first insulation film 1 using the plasma CVD method is preferably 250° C. or lower. For example, the deposition of the first insulation film 1 at 400° C. or higher causes melting of the adhesive layer 35, thereby facilitating peeling of the support substrate 36. On the other hand, the first insulation film 1 is difficult to deposit at too low temperatures, and therefore, the temperature is preferably 100° C. or higher, or more preferably, 120° C. or higher.

The first insulation film 1 is preferably deposited to have a thickness of 100 μm or higher and 1000 μm or smaller in one deposition process. The thickness of the deposited film differs depending on positions, and the thickness of the insulation film on the first surface F1 side of the semiconductor substrate 10 is used as a reference in the embodiment. When the thickness of the first insulation film 1 is too small, the thickness of the insulation film on the side wall on the bottom side of the via hole VH may not be sufficient. When the thickness of the first insulation film 1 is too large, the thickness of the insulation film at the bottom of the via hole VH is also very large, which may make it difficult to etch the insulation film at the bottom of the via hole VH or may cause an insufficient thickness of an insulation film on the first surface F1 after etching is performed, in some cases.

The first insulation film 1 is preferably a silicon oxinitride film that is deposited in an atmosphere containing a low reactive silicon compound. More specifically, the first insulation film 1 is preferably deposited in an atmosphere containing a tetraethyl orthosilicate (TEOS) gas as a low reactive silicon compound, an oxygen-containing gas, and an NH group-containing gas. Typically, the oxygen-containing gas preferably contains one or more kinds selected from a group consisting of $NO_2$, $O_2$, NO, and other oxygen-containing materials. Typically, the NH group-containing gas contains $NH_3$ gas and preferably further contains $N_2$ gas as necessary.

Figure 5:
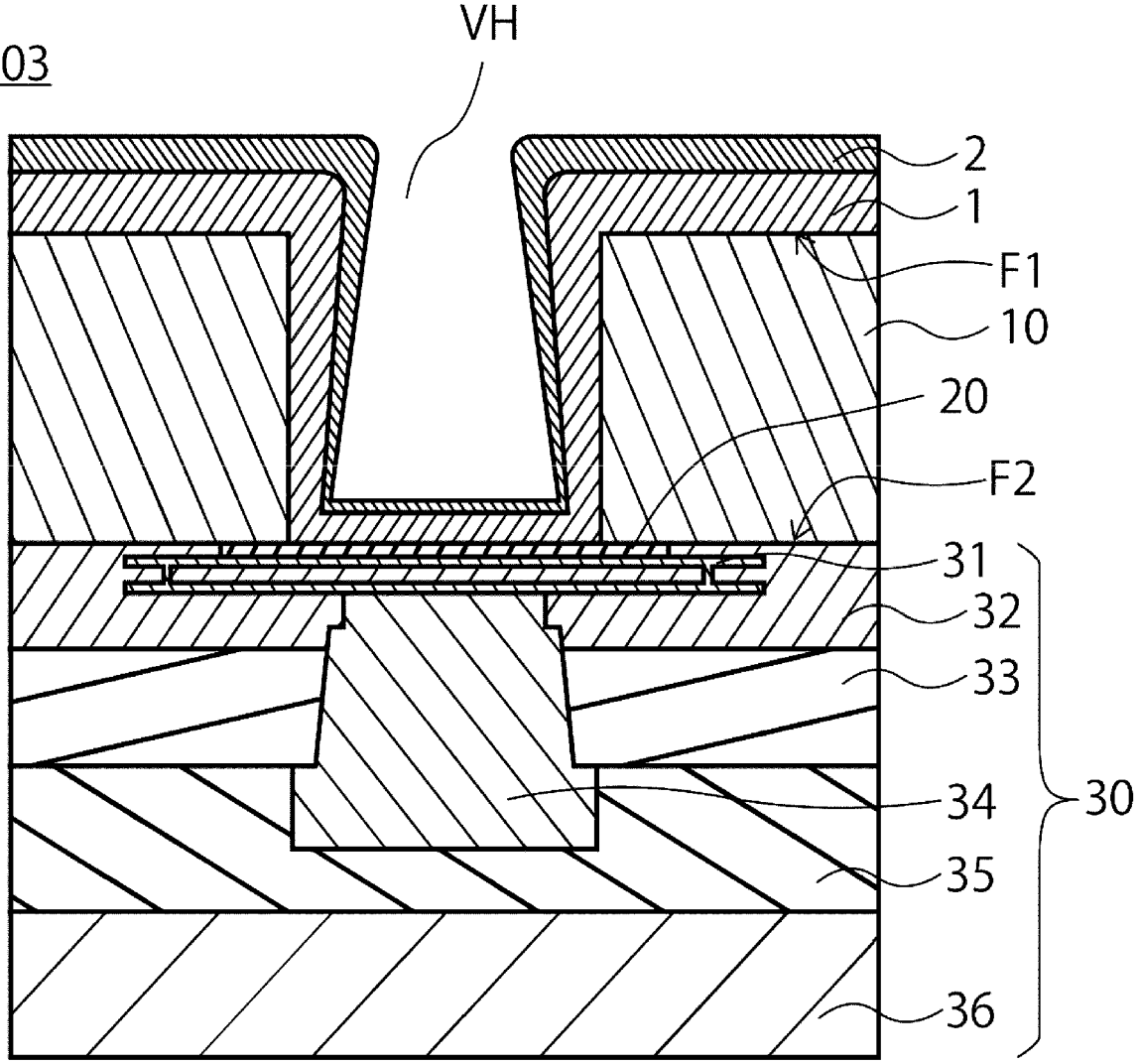

Next, the process of depositing a second insulation film 2 (S02) is described. As illustrated in FIG. 5, a second insulation film 2 having a low covering property is deposited in the via hole VH and on the first surface F1 side of the workpiece 102 in FIG. 4, whereby a workpiece 103 is obtained. The second insulation film 2 is deposited on the first surface F1 side of the semiconductor substrate 10, or more precisely, on a surface on a side opposite to the first surface F1 side of the first insulation film 1. The second insulation film 2 is also deposited on the side wall and the bottom of the via hole VH.

The second insulation film 2 is preferably deposited by the plasma CVD method as in the case of the first insulation film 1. The second insulation film 2 tends to overhang greater than the first insulation film 1, and therefore, it is difficult to control the thickness of the deposited film subjected to etching, when only the second insulation film 2 is deposited. It is preferable to deposit the first insulation film 1 and the second insulation film 2 with appropriate thicknesses so that the insulation film subjected to etching will have a required thickness at each of the first surface F1 and the side wall of the via hole VH. In the manufacturing method of the embodiment, both of the first insulation film 1 having the high covering property and the second insulation film 2 having the low covering property are deposited, whereby respective characteristics thereof are effectively used. The second insulation film 2 having the low covering property is concentratedly deposited on the first surface F1 side of the semiconductor substrate 10 and at the opening of the via hole VH in such a manner as to be thicker on the first surface F1 side of the semiconductor substrate 10 than at the bottom of the via hole VH compared with the case of the first insulation film 1 and to narrow the opening of the via hole VH. The second insulation film 2 is hardly deposited on the bottom side of the via hole VH, and therefore, there may be a portion in which the second insulation film 2 is not formed at the bottom and the side wall on the bottom side of the via hole VH.

The temperature of deposition of the second insulation film 2 using the plasma CVD method is preferably 250° C. or lower. For example, the deposition of the second insulation film 2 at 400° C. or higher causes melting of the adhesive layer 35, thereby facilitating peeling of the support substrate 36. On the other hand, the second insulation film 2 is difficult to deposit at too low temperatures, and therefore, the temperature is preferably 100° C. or higher, or more preferably, 120° C. or higher.

The second insulation film 2 is deposited to have a thickness of 100 μm or higher and 1000 μm or smaller in one deposition process. The thickness of the deposited film differs depending on positions, and the thickness of the insulation film on the first surface F1 side of the semiconductor substrate 10 is used as a reference in the embodiment. When the thickness of the deposited second insulation film 2 is too large, the thickness of the insulation film in the vicinity of the opening of the via hole VH is also very large, or the opening of the via hole VH is closed, whereby etching may be difficult to perform, in some cases.

The second insulation film 2 is preferably a silicon oxinitride film that is deposited in an atmosphere containing a highly reactive silicon compound. More specifically, the second insulation film 2 is preferably deposited in an atmosphere containing a monosilane ($SiH_4$) gas as a highly reactive silicon compound, an oxygen-containing gas, and an NH group-containing gas. Typically, the oxygen-containing gas preferably contains one or more kinds selected from a group consisting of $NO_2$, $O_2$, NO, and other oxygen-containing materials. Typically, the NH group-containing gas contains $NH_3$ gas and preferably further contains $N_2$ gas as necessary.

The deposition of the first insulation film 1 and deposition of the second insulation film 2 may be switched by changing amounts of supply of the low reactive silicon compound and the highly reactive silicon compound. The insulation films having different covering properties are formed by such a simple operation as to change the concentrations of gases. Thus, this operation is preferable because of reduction in the number of processes and cost efficiency.

The second insulation film 2 is deposited after the first insulation film 1 is deposited. Thus, the first insulation film 1 is in contact with the semiconductor substrate 10, and the second insulation film 2 is in contact with a surface on a side opposite to the surface in contact with the semiconductor substrate 10 of the first insulation film 1. That is, the first insulation film 1 is in direct contact with the semiconductor substrate 10, and the second insulation film 2 is in direct contact with the surface on the side opposite to the surface in direct contact with the semiconductor substrate 10 of the first insulation film 1.

The process of depositing the second insulation film 2 (S02) may be performed prior to the process of depositing the first insulation film 1 (S01) as described in another embodiment. Alternatively, one or both of the process of depositing the first insulation film 1 (S01) and the process of depositing the second insulation film 2 (S02) may be performed multiple times while the process of depositing the first insulation film 1 (S01) and the process of depositing the second insulation film 2 (S02) are alternately performed.

In the case of depositing the second insulation film 2 after the first insulation film 1 is deposited, a surface, or preferably, the entire surface of the first insulating film 1 facing the semiconductor substrate 10 and located closest to the semiconductor substrate 10, is preferably in direct contact with a surface of the semiconductor substrate 10 facing the first insulation film 1, as shown in the workpiece 103 in FIG. 5. Moreover, a surface, or preferably, the entire surface of the second insulating film 2 facing the semiconductor substrate 10 and located closest to the semiconductor substrate 10 is preferably in direct contact with a surface of the first insulation film 1 facing the second insulation film 2. Alternatively, a part of a surface, or preferably, the entire surface of the second insulation film 2 facing the semiconductor substrate 10 and located closest to the semiconductor substrate 10 is preferably in direct contact with a surface of the first insulation film 1 facing the second insulation film 2, and the rest of the surface is preferably indirect contact with a surface of the semiconductor substrate 10 facing the second insulation film 2.

Figure 6:
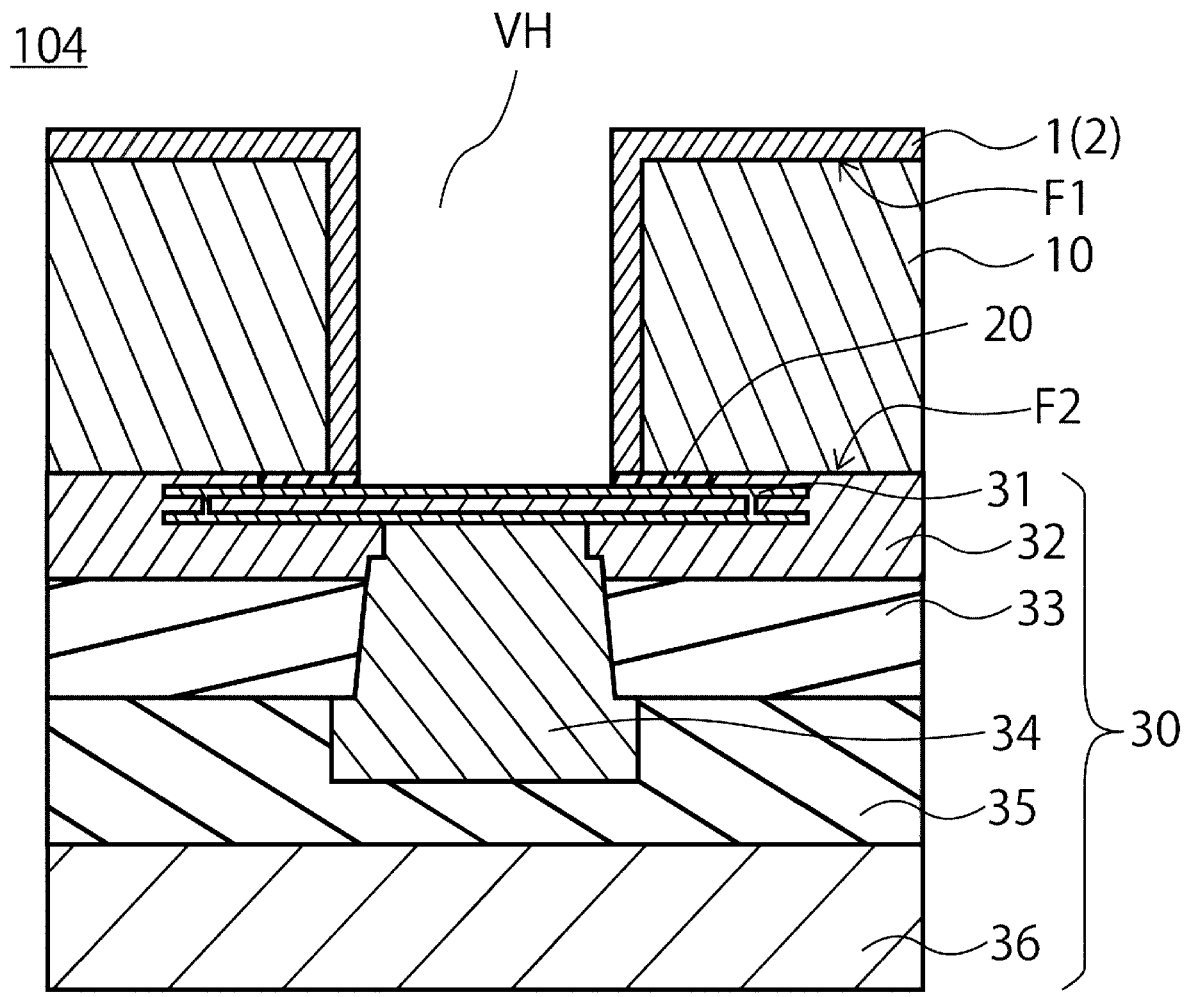

Next, the process of removing an insulation film at the bottom of the via hole VH by anisotropic etching (S03) is described. As illustrated in FIG. 6, the first insulation film 1 and the second insulation film 2 at the bottom of the via hole VH of the workpiece 103 in FIG. 5 are removed, whereby a workpiece 104 is obtained. The insulation films at the bottom of the via hole VH are removed by etching. In the case of the structure of the semiconductor device 100 in FIG. 1, the insulation film existing on the semiconductor substrate 10 side of the wiring circuit 31 of the semiconductor layer 30, which is the STI film 20 in FIG. 1, is also removed by etching, whereby the wiring circuit 31 of the semiconductor layer 30 is exposed. The anisotropic etching in a vertical direction relative to the first surface F1 also removes a part of the insulation films on the side wall of the via hole VH.

For example, when only the first insulation film 1 having the high covering property is deposited, an insulation film having a thickness similar to that of an insulation film on the first surface F1 is also deposited on the bottom of the via hole VH. In this case, the first insulation film 1 on the first surface F1 is also removed when the insulation film at the bottom of the via hole VH is removed by anisotropic etching. However, depositing both of the first insulation film 1 having the high covering property and the second insulation film 2 having the low covering property enables increasing the thickness of the insulation film on the first surface F1 side of the semiconductor substrate 10 while preventing an increase in thickness of the insulation film at the bottom of the via hole VH. The insulation film at the bottom of the via hole VH is formed more easily in the case in which the aspect ratio of the via hole VH is smaller. However, the second insulation film 2 having the low covering property is hardly deposited at the bottom of the via hole VH, and therefore, the thickness of the insulation film at the bottom of the via hole VH is made sufficiently thinner than the thickness of the insulation film on the first surface F1 side of the semiconductor substrate 10, as illustrated in the sectional view during the process in FIG. 5.

The easiness of the control of the thickness of the insulation film subjected to etching in the manufacturing method of the embodiment is also obtained in the case in which the aspect ratio of the via hole VH is large. However, this merit is effectively obtained in the case in which the aspect ratio of the via hole VH is small, as described above. In a case in which the aspect ratio of the via hole VH is less than 2.8, the merit of the manufacturing method of the embodiment is more effectively obtained. In a case in which the aspect ratio of the via hole VH is 2.0 or less, the manufacturing method of the embodiment is more suitably used. In a case in which the aspect ratio of the via hole VH is 1.5 or less, the manufacturing method of the embodiment is more suitably used.

As the diameter of the via hole VH is increased, the insulation film is more easily formed at the bottom of the via hole VH. For this reason, in a case in which the diameter of the via hole VH is 10 μm or greater, the manufacturing method of the embodiment is more suitably used.

Next, the process of forming a TSV 11 (S04) is described. In this process (S04), a TSV 11 is formed to be coupled to the wiring circuit 31 exposed at the bottom of the via hole VH and to pass through the semiconductor layer 30, and a bump 12 is formed on the TSV 11, in the workpiece 104 in FIG. 6, whereby the semiconductor device 100 in FIG. 1 is obtained. Although not illustrated in the drawing, a barrier metal may be formed either one or both between the TSV 11 and the underlying component and between the bump 34 and the underlying component.

Adapting the manufacturing method of the first embodiment enables obtaining the semiconductor device 100 having an insulation film with a required thickness on the first surface F1 even in the case in which the aspect ratio is small.

Second Embodiment

The second embodiment relates to a method of manufacturing a semiconductor device. The second embodiment is a modification of the method of manufacturing the semiconductor device of the first embodiment. The second embodiment differs from the method of manufacturing the semiconductor device of the first embodiment in that the first insulation film 1 is deposited after the second insulation film 2 is deposited. In the second embodiment, descriptions of the same components and the same processes in the manufacturing method as in the first embodiment are omitted. Instead of the STI film 20, the insulation film 32 exists between the via hole VH and the wiring circuit 31 before etching is performed, in the second embodiment.

The first insulation film 1 is provided as an insulation film for insulating between the TSV 11 and the semiconductor substrate 10 in the semiconductor device 100 according to the first embodiment shown in FIG. 1. On the other hand, in the second embodiment, the second insulation film 2 is formed prior to deposition of the first insulation film 1, and thus, the insulation film for insulating between the TSV 11 and the semiconductor substrate 10 of the semiconductor device 100 is composed primarily of the second insulation film 2 and partially includes the first insulation film 1.

In the second embodiment, the process of depositing the first insulation film 1 (S01) is performed following the process of depositing the second insulation film 2 (S02). The method of manufacturing the semiconductor device 100 of the second embodiment is described with reference to FIGS. 7 and 8. The deposition conditions in the second embodiment are similar to those in the first embodiment except for the order of depositing the insulation films and thicknesses of the insulation films.

Figure 7:
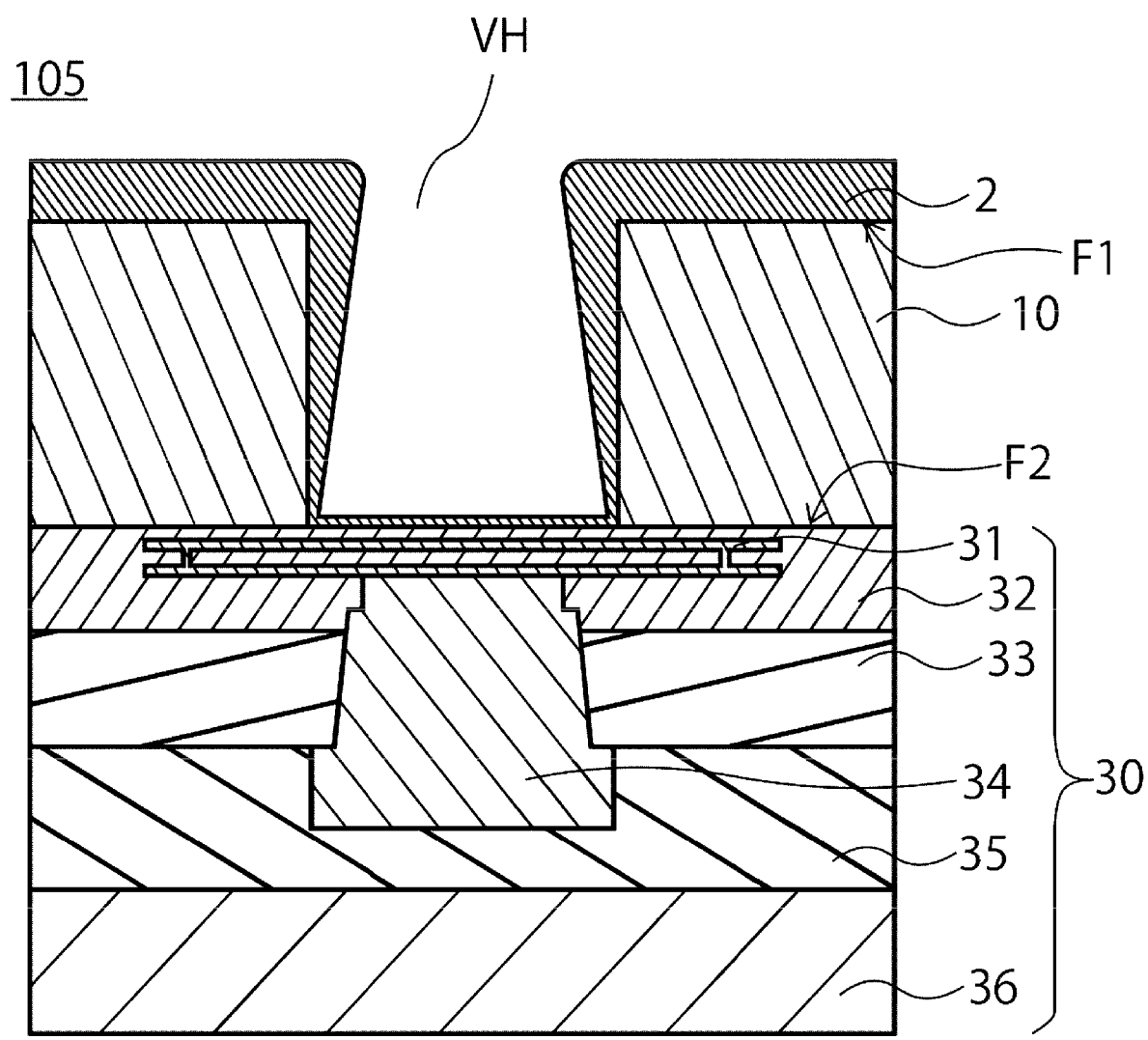
Figure 8:
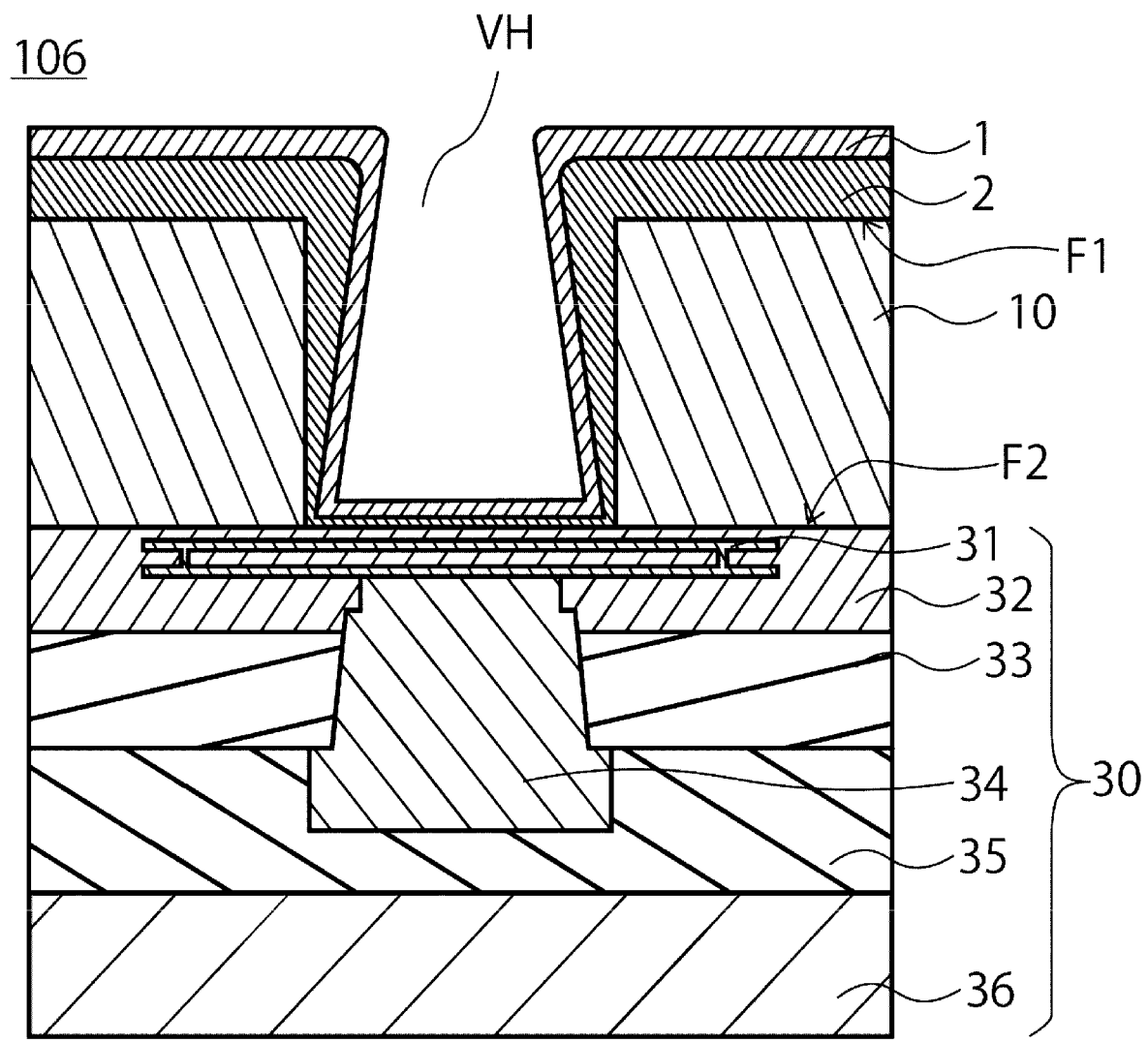

As illustrated in FIG. 7, a second insulation film 2 having a low covering property is deposited in the via hole VH and on the first surface F1 of the workpiece 101 in FIG. 3, whereby a workpiece 105 is obtained. The second insulation film 2 having the low covering property is hardly formed on the side wall of the via hole VH and at the bottom of the via hole VH. Thus, there may be cases in which a thin second insulation film 2 is formed on the side wall of the via hole VH and the surface of the semiconductor substrate 10 is exposed in the via hole VH, after the process of depositing the second insulation film 2 (S02) is performed.

Thereafter, a first insulation film 1 is deposited from the first surface F1 side of the semiconductor substrate 10. As illustrated in the sectional view during the process (S01) in FIG. 8, a first insulation film 1 having a high covering property is deposited in the via hole VH and on the first surface F1 side of the semiconductor substrate 10 of the workpiece 105 in FIG. 7, whereby a workpiece 106 is obtained. When the inside of the via hole VH has a part on which the second insulation film 2 is not deposited in the process of depositing the second insulation film 2 (S02), the first insulation film 1 is deposited on the semiconductor substrate 10 in the via hole VH.

The first insulation film 1 is deposited after the second insulation film 2 is deposited. Thus, after the first insulation film 1 is deposited, the second insulation film 2 is in contact with the semiconductor substrate 10, and the first insulation film 1 is in contact with a surface of the second insulation film 2 opposite to the surface in contact with the semiconductor substrate 10. That is, the second insulation film 2 is in direct contact with the semiconductor substrate 10, and the first insulation film 1 is in direct contact with the surface opposite to the surface of the second insulation film 2 that is in direct contact with the semiconductor substrate 10.

In the second embodiment, the first insulation film 1 is deposited on the first surface F1 side of the semiconductor substrate 10 and on the side wall of the via hole VH, in particular, on the side wall at the bottom, where the thickness of the insulation film is insufficient in the workpiece 105 in FIG. 7. As a result, an insulation film having a required thickness is formed on the first surface F1 and on the side wall of the via hole VH after etching is performed. A semiconductor device 100 having an insulation film with a required thickness on the first surface F1 is obtained in the case in which the aspect ratio is small or the diameter of the via hole VH is large, whichever of the deposition of the first insulation film 1 and the deposition of the second insulation film 2 is performed first.

Third Embodiment

The third embodiment relates to a method of manufacturing a semiconductor device. The third embodiment is a modification of the method of manufacturing the semiconductor device of the first embodiment. The third embodiment differs from the method of manufacturing the semiconductor device of the first embodiment in that the first insulation film 1 is deposited again after the second insulation film 2 is deposited. In the third embodiment, descriptions of the same components and the same processes in the manufacturing method as in the first embodiment are omitted.

In the third embodiment, the process of depositing the first insulation film 1 (S01) is performed again following the process of depositing the second insulation film 2 (S02). The method of manufacturing the semiconductor device 100 of the third embodiment is described with reference to FIG. 9. The deposition conditions in the third embodiment are similar to those in the first embodiment except for the order of depositing the insulation films and thicknesses of the insulation films.

Figure 9:
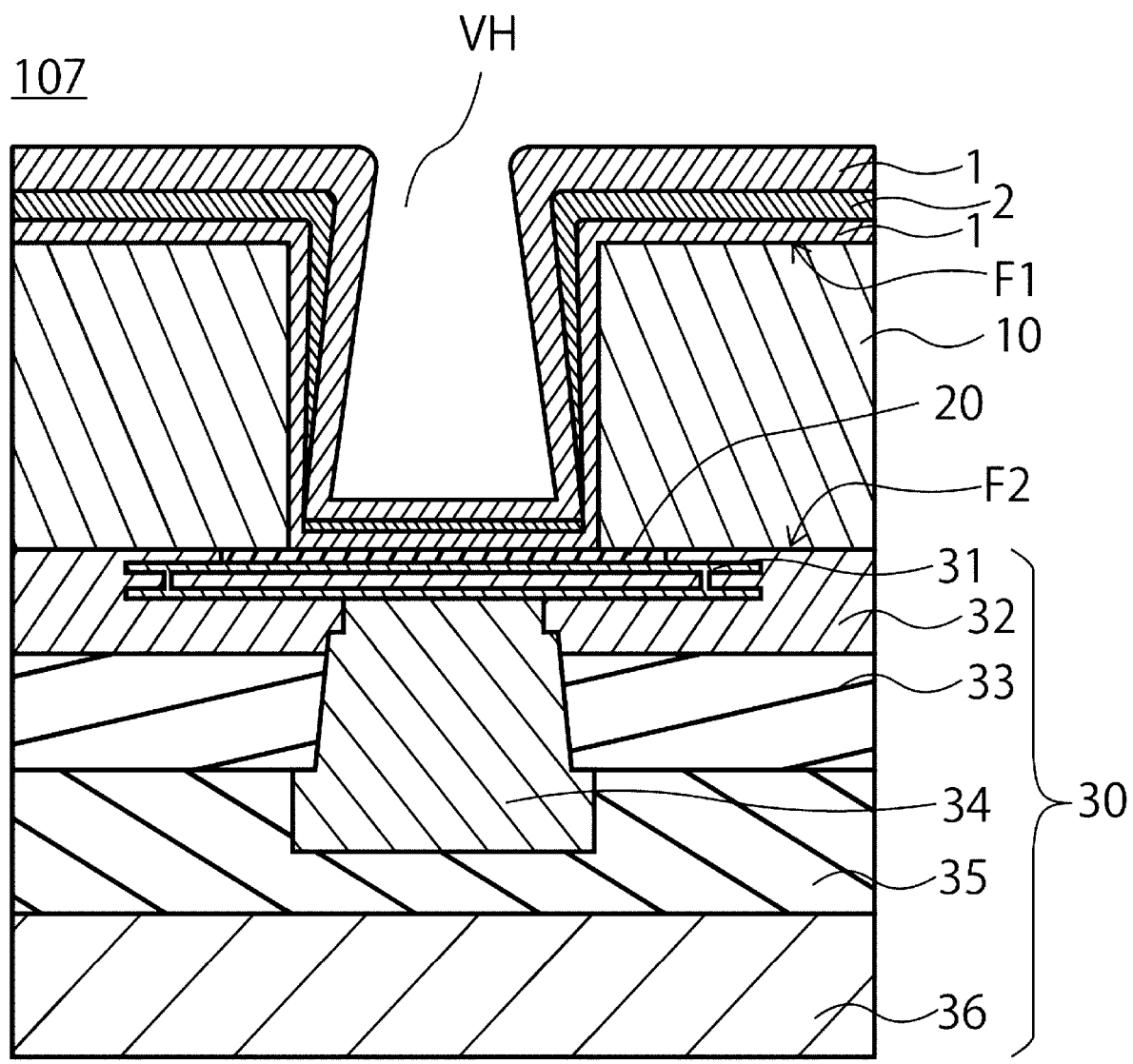

As illustrated in FIG. 9, a first insulation film 1 is further formed on the second insulation film 2 according to the process of depositing the first insulation film 1 (S01) for the second time, whereby a workpiece 107 is obtained. The workpiece 107 in FIG. 9 includes three layers of the insulation films that are formed in the via hole VH and on the first surface F1. The workpiece 107 in FIG. 9 is also subjected to anisotropic etching as in the case of the first embodiment, whereby a semiconductor device 100 having an insulation film with a required thickness is obtained. In some cases, stacking three or more layers of the insulation films may enable control the thickness of an insulation film subjected to etching, which is difficult to perform by using a stack of two layers. The deposition of the first insulation film 1 again after the first insulation film 1 and the second insulation film 2 are deposited, provides a semiconductor device 100 having an insulation film with a required thickness on the first surface F1 in the case in which the aspect ratio is small or the diameter of the via hole VH is large.

In the third embodiment, the first insulation film 1 and the second insulation film 2 are alternately stacked, whereby two layers of the first insulation films 1 and one layer of the second insulation film 2 are deposited. A modification example of the third embodiment includes a method of manufacturing a semiconductor device by alternately stacking a first insulation film 1 and a second insulation film 2 to deposit two or more layers of the first insulation films 1 and two or more layers of the second insulation films 2.

Fourth Embodiment

The fourth embodiment relates to a method of manufacturing a semiconductor device. The fourth embodiment is a modification of the method of manufacturing the semiconductor device of the second embodiment. The fourth embodiment differs from the method of manufacturing the semiconductor device of the second embodiment in that the second insulation film 2 is deposited again after the first insulation film 1 is deposited. In the fourth embodiment, descriptions of the same components and the same processes in the manufacturing method as in the second embodiment are omitted. In the fourth embodiment, the wiring circuit 31 is exposed at a part of a surface on the second surface F2 side of the semiconductor substrate 10 of the semiconductor layer 30.

In the fourth embodiment, the process of depositing the second insulation film 2 (S02) is performed again following the process of depositing the first insulation film 1 (S01). The method of manufacturing the semiconductor device 100 of the fourth embodiment is described with reference to FIG. 10. The deposition conditions in the fourth embodiment are similar to those in the first embodiment except for the order of depositing the insulation films and thicknesses of the insulation films.

Figure 10:
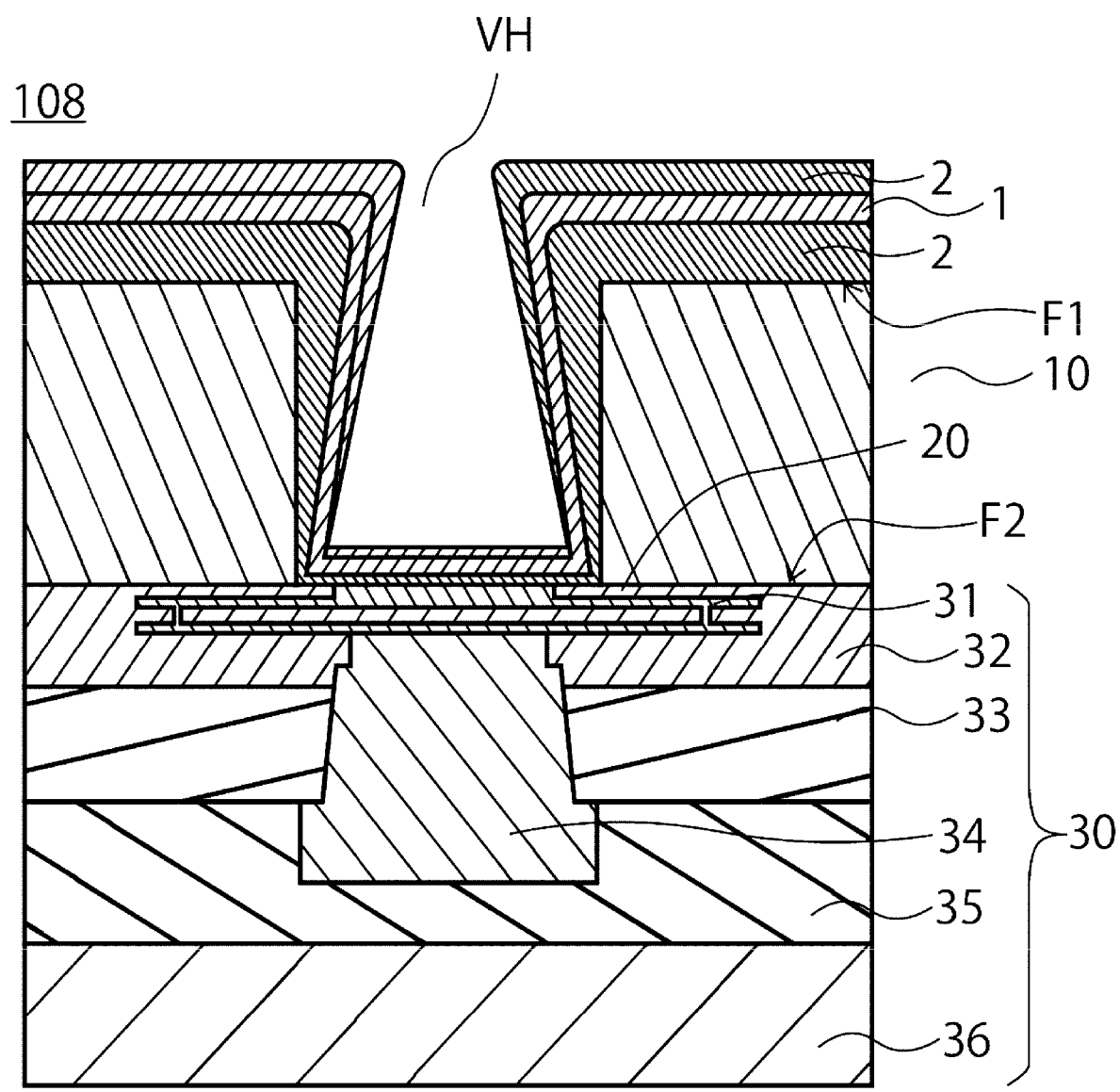

As illustrated in the sectional view during the process in FIG. 10, a second insulation film 2 is further formed on the first insulation film 1 according to the process of depositing the second insulation film 2 (S02) for the second time, whereby a workpiece 108 is obtained. The workpiece 108 in FIG. 10 includes three layers of the insulation films that are formed in the via hole VH and on the first surface F1. The workpiece 108 in FIG. 10 is also subjected to anisotropic etching as in the case of the second embodiment, whereby a semiconductor device 100 having an insulation film with a required thickness is obtained. In some cases, stacking three or more layers of the insulation films may enable control of the thickness of an insulation film subjected to etching, which is difficult to perform by using a stack of two layers. The deposition of the second insulation film 2 again after the second insulation film 2 and the first insulation film 1 are deposited, provides a semiconductor device 100 having an insulation film with a required thickness on the first surface F1 is obtained in the case in which the aspect ratio is small or the diameter of the via hole VH is large.

In the fourth embodiment, the first insulation film 1 and the second insulation film 2 are alternately stacked, whereby one layer of the first insulation film 1 and two layers of the second insulation films 2 are deposited. A modification example of the fourth embodiment includes a method of manufacturing a semiconductor device by alternately stacking a first insulation film 1 and a second insulation film 2 to deposit two or more layers of the first insulation films 1 and two or more layers of the second insulation films 2.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A method of manufacturing a semiconductor device, comprising:
   depositing a first insulation film in a via hole of a semiconductor substrate and above a first surface thereof, the semiconductor substrate having a circuit substrate on a second surface thereof;
   depositing a second insulation film having a covering property lower than the first insulation film in the via hole and above the first surface of the semiconductor substrate; and removing the first and second insulation films deposited at the bottom of the via hole by anisotropic etching.

2. The method according to claim 1, wherein
the second insulation film is deposited after the first insulation film is deposited, and
the second insulation film above the first surface of the semiconductor substrate is removed by the anisotropic etching.

3. The method according to claim 2, wherein
the second insulation film formed on the first insulation film on a side surface of the via hole is removed by the anisotropic etching.

4. The method according to claim 2, wherein
a thickness of the first insulation film formed on an upper portion of a side surface of the via hole is greater than a thickness of the first insulation film formed on a lower portion of the side surface of the via hole.

5. The method according to claim 1, wherein
the first insulation film is deposited after the second insulation film is deposited, and
the first insulation film above the first surface of the semiconductor substrate is removed by the anisotropic etching.

6. The method according to claim 5, wherein
the first insulation film formed on the second insulation film on a side surface of the via hole is removed by the anisotropic etching.

7. The method according to claim 5, wherein
a thickness of the second insulation film formed on an upper portion of a side surface of the via hole is greater than a thickness of the second insulation film formed on a lower portion of the side surface of the via hole.

8. The method according to claim 1, further comprising:
forming the via hole in the semiconductor substrate before depositing the first and second insulation films.

9. The method according to claim 8, wherein
the via hole extends in a direction from the first surface towards the second surface.

10. The method according to claim 1, wherein
the circuit substrate includes a wiring circuit below the via hole.

11. The method according to claim 10, further comprising:
forming a through silicon via (TSV) contacting the wiring circuit through the via hole after the anisotropic etching.

12. The method according to claim 1, wherein
the first and second insulation films are deposited at 250° C. or lower by a plasma CVD method.

13. The method according to claim 1, wherein
an aspect ratio of the via hole is less than 2.8, the aspect ratio being calculated by dividing a depth of the via hole by a diameter of the via hole.

14. The method according to claim 1, wherein
a diameter of the via hole is 10 μm or greater.

15. The method according to claim 1, wherein
the first insulation film is deposited in an atmosphere including a tetraethyl orthosilicate gas, an oxygen-containing gas, and an NH group-containing gas, and
the second insulation film is deposited in an atmosphere including a silane gas, an oxygen-containing gas, and an NH group-containing gas.

16. The method according to claim 15, further comprising:
switching supply of the tetraethyl orthosilicate gas and the silane gas after the deposition of one of the first and second insulation films which is formed first.

17. The method according to claim 1, wherein
the second insulation film is deposited after the first insulation film is deposited such that first and second surfaces of the first insulation film are in contact with the semiconductor substrate and the second insulation film, respectively.

18. The method according to claim 1, wherein
the first insulation film is deposited after the second insulation film is deposited such that first and second surfaces of the second insulation film are in contact with the semiconductor substrate and the first insulation film, respectively.

19. The method according to claim 1, wherein
the second insulation film is deposited after the first insulation film is deposited, and
the method further comprises depositing a third insulating film having the same covering property as the first insulation film in the via hole and above the first surface of the semiconductor substrate.

20. The method according to claim 1, wherein
the first insulation film is deposited after the second insulation film is deposited, and
the method further comprises depositing a third insulating film having the same covering property as the second insulation film in the via hole and above the first surface of the semiconductor substrate.

* * * * *